(12) United States Patent
Magod Ramakrishna

(10) Patent No.: US 10,826,465 B2
(45) Date of Patent: Nov. 3, 2020

(54) REDUCED QUIESCENT CURRENT PVT COMPENSATED OSCILLATOR

(71) Applicant: TEXAS INSTRUMENTS INCORPORATED, Dallas, TX (US)

(72) Inventor: Raveesh Magod Ramakrishna, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/742,030

(22) Filed: Jan. 14, 2020

(65) Prior Publication Data

US 2020/0228101 A1 Jul. 16, 2020

Related U.S. Application Data

(60) Provisional application No. 62/792,522, filed on Jan. 15, 2019.

(51) Int. Cl.
*H03K 3/0231* (2006.01)
*H03K 3/011* (2006.01)
*H03K 3/012* (2006.01)
*H03K 3/017* (2006.01)

(52) U.S. Cl.
CPC ............ *H03K 3/011* (2013.01); *H03K 3/012* (2013.01); *H03K 3/017* (2013.01); *H03K 3/02315* (2013.01)

(58) Field of Classification Search
CPC ........ H03K 3/011; H03K 3/012; H03K 3/017; H03K 3/0231; H03K 3/02315; H03K 4/50
USPC .................................................. 331/111, 143
See application file for complete search history.

(56) References Cited

U.S. PATENT DOCUMENTS

| | | | | |
|---|---|---|---|---|
| 9,503,059 B1* | 11/2016 | Margarit | ................ | H03K 3/011 |
| 2006/0250191 A1* | 11/2006 | Daniel | .................. | H03K 3/012 |
| | | | | 331/1 A |
| 2013/0285729 A1* | 10/2013 | Xu | .......................... | H03K 4/502 |
| | | | | 327/308 |
| 2014/0327486 A1 | 11/2014 | Roine et al. | | |
| 2016/0013753 A1* | 1/2016 | Tam | ......................... | H03K 4/50 |
| | | | | 331/111 |
| 2016/0211852 A1* | 7/2016 | Kim | ......................... | H03B 5/24 |

(Continued)

OTHER PUBLICATIONS

Magod, R., "A 1.24 μA Quiescent Current NMOS Low Dropout Regulator With Integrated Low-Power Oscillator-Driven Charge-Pump and Switched-Capacitor Pole Tracking Compensation," IEEE Journal of Solid-State Circuits, vol. 53, No. 8, Aug. 2018, pp. 2356-2367.

(Continued)

*Primary Examiner* — Levi Gannon
(74) *Attorney, Agent, or Firm* — Lawrence J. Bassuk; Charles A. Brill; Frank D. Cimino

(57) ABSTRACT

A device includes a capacitor having a first terminal coupled to a ground node, and a second terminal; a first transistor having a source coupled to the capacitor, a drain coupled to a first node, and a gate; a first current source coupled to the first node and configured to couple to a regulated supply node; a second transistor having a source coupled to the ground node, a drain coupled to a second node, and a gate coupled to the second node and to the gate of the first transistor; and a comparator circuit having an input coupled to the first node and an output configured to couple to a clock node.

20 Claims, 7 Drawing Sheets

(56) References Cited

U.S. PATENT DOCUMENTS

2017/0040944 A1* 2/2017 Satoh .................. H03B 1/00
2019/0158133 A1* 5/2019 Wang .................. H03K 4/50

OTHER PUBLICATIONS

Denier, U., "Analysis and Design of an Ultralow-Power CMOS Relaxation Oscillator," IEEE Transactions on Circuits and Systems, I:Regular Papers, vol. 57, No. 8, Aug. 2010, pp. 1973-1982.
Griffith et al., "A190nW 33kHz RC Oscillator with ±0.21% Temperature Stability and 4ppm Long-Term Stability," ISSCC 2014, Session 17, Analog Techniques, 17.8, 2014 IEEE International Solid-State Circuits Conference, Feb. 11, 2014, 3 p.

* cited by examiner

10,826,465 B2

REDUCED QUIESCENT CURRENT PVT COMPENSATED OSCILLATOR

CROSS-REFERENCE TO RELATED APPLICATIONS

The present application claims priority to U.S. Provisional Patent Application No. 62/792,522, which was filed Jan. 15, 2019, is titled "Ultra-Low Quiescent Current PVT Compensated Oscillator With Integrated Sub-Regulator," and is hereby incorporated herein by reference in its entirety.

BACKGROUND

Electronic devices benefit from reduced power consumption, particularly where the electronic device is powered by a battery. An example electronic device includes computing circuitry, such as a processing device, which performs computing operations in support of the functionality of the electronic device. In order to reduce the power consumption of the electronic device, the computing circuitry operates in a duty cycled fashion, in which the computing circuitry occasionally (e.g., periodically) enters a high power mode to carry out various computing operations, and then enters a low power mode after the computing operations are complete. By reducing the duty cycle, or the ratio of the high power mode time period to the total of the high power mode time period and the low power mode time period, power consumption of the electronic device is reduced.

SUMMARY

In accordance with at least one example of the disclosure, a device includes a capacitor having a first terminal coupled to a ground node, and a second terminal; a first transistor having a source coupled to the capacitor, a drain coupled to a first node, and a gate; a first current source coupled to the first node and configured to couple to a regulated supply node; a second transistor having a source coupled to the ground node, a drain coupled to a second node, and a gate coupled to the second node and to the gate of the first transistor; and a comparator circuit having an input coupled to the first node and an output configured to couple to a clock node.

In accordance with another example of the disclosure, a system includes computing circuitry configured to enter a high power mode in response to receiving an edge of a clock signal and an oscillator coupled to the computing circuitry and configured to provide the clock signal to the computing circuitry. The relaxation oscillator includes a capacitor having a first terminal coupled to a ground node, and a second terminal; a first transistor having a source coupled to the capacitor, a drain coupled to a first node, and a gate; a first current source coupled to the first node and to a regulated supply node; a second transistor having a source coupled to the ground node, a drain coupled to a second node, and a gate coupled to the second node and to the gate of the first transistor; and a comparator circuit having an input coupled to the first node and an output coupled to a clock node to provide the clock signal to the computing circuitry.

In accordance with yet another example of the disclosure, a device includes a capacitor coupled to a ground node; a current source configured to charge the capacitor; a first transistor coupled to the capacitor and configured to turn off in response to a voltage across the capacitor exceeding a threshold voltage less than a gate voltage of the first transistor. The device also includes a comparator circuit having an input coupled to the first transistor and an output coupled to a clock node. The comparator circuit is configured to assert its output when a voltage at the input is above a trip voltage, where the trip voltage is greater than the threshold voltage less than the gate voltage of the first transistor. The device also includes a second transistor configured to increase the gate voltage of the first transistor in response to an increase in a threshold voltage of the second transistor.

BRIEF DESCRIPTION OF THE DRAWINGS

For a detailed description of various examples, reference will now be made to the accompanying drawings in which.

DETAILED DESCRIPTION

Figure 1A:
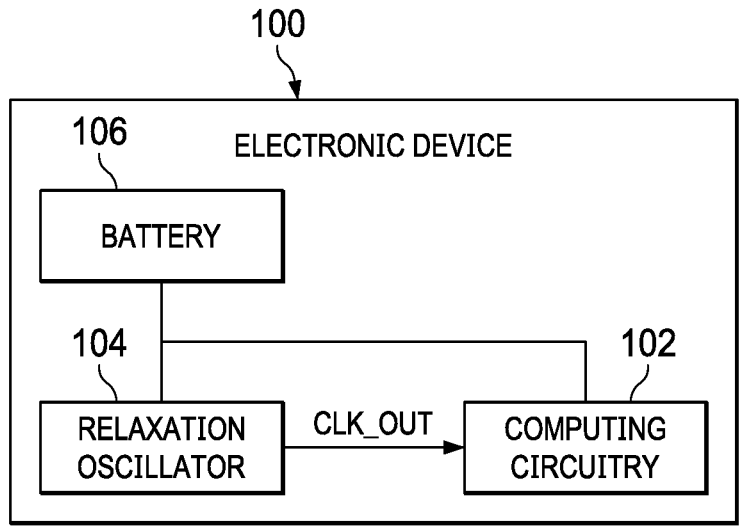
FIG. 1a shows a block diagram of a system in accordance with various examples.

Regulation of duty cycled operation of an electronic device can be accomplished with clock-based duty cycle regulation, in which a periodic clock signal causes the computing circuitry to enter a first operating mode (e.g., enables a high power mode of the computing circuitry). In these examples, a relaxation oscillator provides a clock signal to the computing circuitry and, for example, a rising edge of the clock signal causes the computing circuitry to enter the first mode (e.g., the high power mode). The relaxation oscillator continually provides the clock signal to the computing circuitry (e.g., is always on), and thus reducing the quiescent current of the relaxation oscillator further reduces the power consumption of the electronic device. Further, it is generally beneficial to maintain a stable relaxation oscillator frequency across process, voltage, and temperature (PVT) variations.

Certain relaxation oscillators operate by using a current source to charge a capacitor, the voltage across which is an input to a comparator circuit. When the voltage across the capacitor exceeds a "trip" voltage of the comparator circuit, the comparator circuit asserts an output signal. A latch, such as a D flip flop, is coupled to the output of the comparator circuit and is configured to toggle its output in response to the assertion of the output signal. Additionally, the capacitor is discharged in response to the assertion of the output signal, for example, by a transistor in parallel with the capacitor that is turned on in response to the assertion of the output signal. When the capacitor is discharged, the voltage across the capacitor falls below the trip voltage of the comparator circuit, and the comparator circuit de-asserts its output signal. When the capacitor is again charged to a voltage above the trip voltage, the comparator circuit asserts its output signal, the D flip flop toggles its output, and the process repeats itself. The output of the D flip flop is used as the clock signal that the relaxation oscillator provides to the computing circuitry, or other circuitry that receives a clock signal.

The current source charges the capacitor at a constant rate, and thus the voltage across the capacitor increases linearly. As a result, as the voltage across the capacitor approaches the trip voltage of the comparator circuit, a switching current is generated in the comparator circuit that adds to the quiescent current of the relaxation oscillator. The quiescent current is further increased in situations where the capacitor charges more slowly, and thus the voltage across the capacitor is near but below the trip voltage of the comparator circuit for a longer period of time each cycle. Additionally, the current source is dependent on temperature, and thus the rate of voltage increase across the capacitor is also dependent on temperature. As a result, the frequency of the relaxation oscillator is dependent on temperature, which is not desirable.

Examples of this disclosure include a transistor in series with the capacitor, between the capacitor and the current source. The comparator circuit input is coupled to the transistor rather than to the capacitor. Initially, when the transistor is charging from a discharged state, the transistor is on and thus the capacitor charges normally. As the voltage across the capacitor reaches a gate voltage of the transistor, less a threshold voltage of the transistor, the transistor turns off. When the transistor turns off, the parasitic capacitance of the transistor is more quickly charged by the current source because the parasitic capacitance is less than the capacitance of the capacitor. The input to the comparator circuit is the voltage at the transistor, which rises rapidly once the transistor is turned off.

As a result, the voltage at the input of the comparator circuit rises rapidly across the trip voltage of the comparator circuit, rather than relatively slowly as with the linear rise in voltage across just a capacitor as described above. The rapid rise of the voltage at the input of the comparator circuit across the trip voltage reduces the switching current through the comparator circuit because its input voltage spends less time (e.g., each cycle) near the comparator circuit trip voltage. Additionally, because the input voltage to the comparator circuit rises rapidly, any impact of fluctuation in trip voltage of the comparator circuit (e.g., due to PVT variations) and its corresponding effect on frequency of the relaxation oscillator is reduced. Further, a second transistor of the same or similar type as the first transistor is used to bias the gate voltage of the first transistor. As a result of being the same or similar type, any change to the threshold voltage of the first and second transistors (e.g., due to PVT variations) is reflected in the gate voltage of the first transistor, which effectively compensates for such PVT variations. These and other advantages of examples of the present disclosure are explained further below.

FIG. 1a depicts an electronic device 100 in accordance with examples of this disclosure. The electronic device 100 includes computing circuitry 102, such as a processing device, which performs computing operations in support of the functionality of the electronic device 100. As explained above, the computing circuitry 102 is configured to operate in a duty cycled fashion, in which the computing circuitry 102 occasionally (e.g., periodically) enters a first mode (e.g., a high power mode) to carry out various computing operations, and then enters a second mode (e.g., a low power or standby mode) after the computing operations are complete. By reducing the duty cycle of the computing circuitry 102, or the ratio of the high power mode time period to the total of the high power mode time period and the low power mode time period, power consumption of the electronic device 100 is reduced.

The electronic device 100 also includes a relaxation oscillator 104 coupled to the computing circuitry 102. The relaxation oscillator 104 is configured to provide a periodic clock signal (CLK_OUT) that causes the computing circuitry 102 to enter the first mode (e.g., the high power mode). For example, a rising edge of CLK_OUT causes the computing circuitry 102 to enter the high power mode. The relaxation oscillator 104 is always on to continually provide CLK_OUT to the computing circuitry 102, and thus examples of this disclosure benefit from reducing the quiescent current of the relaxation oscillator 104, which further reduces the power consumption of the electronic device 100.

In the example of FIG. 1a, the electronic device 100 further includes a battery 106, which serves as a power source for both the computing circuitry 102 and the relaxation oscillator 104. Although the battery 106 is depicted as a part of the electronic device 100, in other examples, the battery 106 is external to the electronic device 100 and coupled to the electronic device via a suitable connector. In yet other examples, the battery 106 is replaced by another power source (e.g., a power converter coupled to AC mains power). Examples of this disclosure are not limited to a particular type of power source or supply. Applications utilizing the relaxation oscillator 104 described herein benefit from reduced quiescent current, more consistent performance across PVT variations, and/or enhanced adjustability for a variety of combinations of frequency and device size requirements. In other examples of this disclosure, the relaxation oscillator 104 provides CLK_OUT to other circuitry (e.g., in addition to or in place of computing circuitry 102), and is not limited to providing CLK_OUT solely to the computing circuitry 102.

Figure 1B:
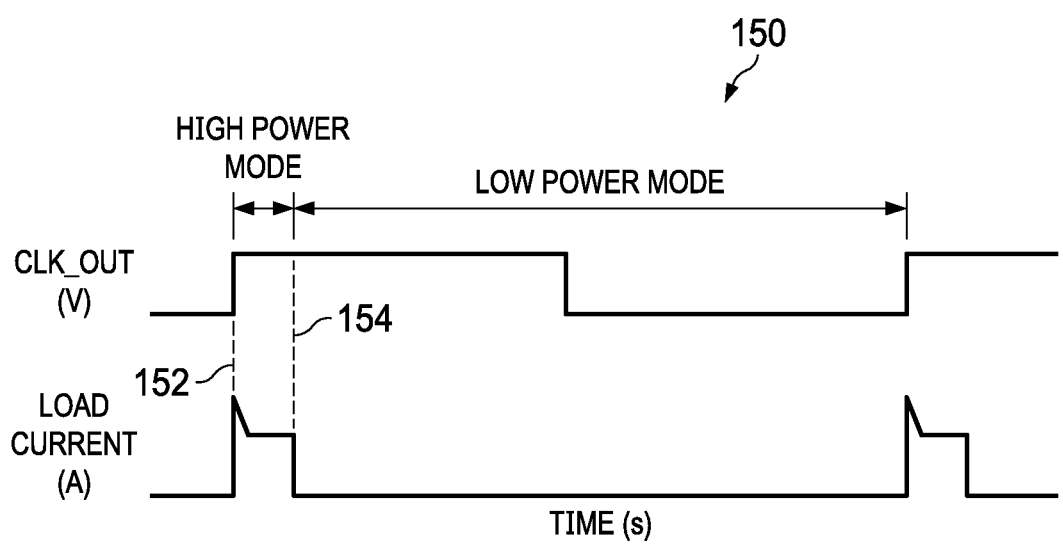
FIG. 1b shows a set of waveforms demonstrating duty cycled operation of the system of FIG. 1a in accordance with various examples.

FIG. 1b depicts an example set of waveforms 150 that demonstrate the CLK_OUT signal generated by the relaxation oscillator 104 and its relation to the high and low power mode time periods of the computing circuitry 102. In FIG. 1b, the x-axis of the waveforms 150 corresponds to time (e.g., in seconds), while the y-axis of the CLK_OUT waveform represents a signal voltage (e.g., in volts) and the y-axis of the load current waveform represents a current (e.g., in amperes). In the example of FIG. 1b, a rising edge of CLK_OUT at time 152 causes the computing circuitry 102 to enter the high power mode. The computing circuitry 102 does not necessarily remain in the high power mode for the duration that CLK_OUT is asserted, but rather enters the lower power mode when computing operations are complete, for example, at time 154 as shown.

Figure 2A:
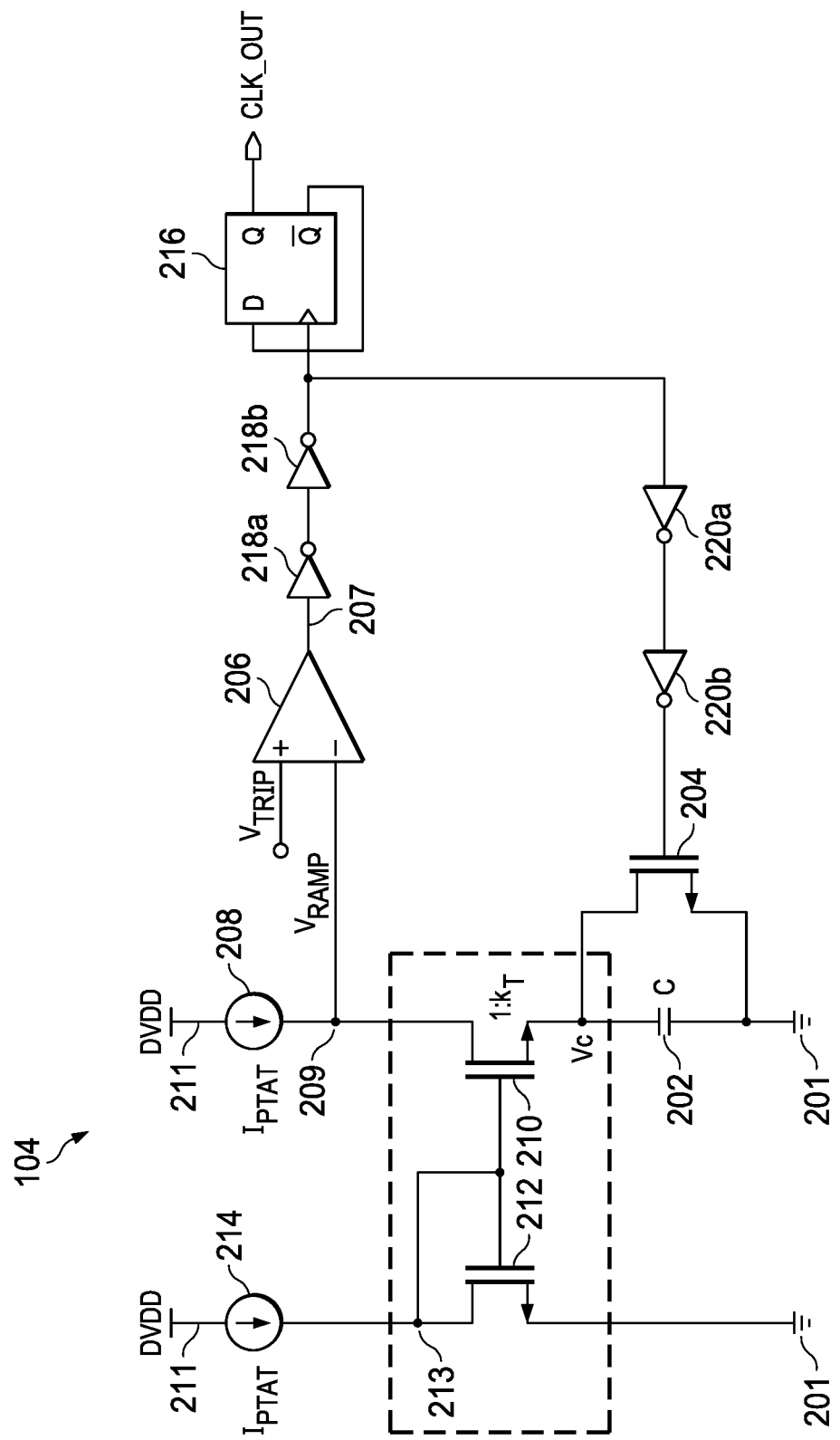
FIG. 2a shows a schematic diagram of a relaxation oscillator circuit in accordance with various examples.

FIG. 2a depicts the relaxation oscillator 104 in further detail. In particular, the relaxation oscillator 104 includes a capacitor 202 coupled to a ground node 201. A first transistor 210 is coupled to the capacitor 202 and to a first node 209. A voltage at the first node 209 is an input to a comparator circuit 206, which in this example compares the voltage at the first node 209 ($V_{RAMP}$) to a trip voltage ($V_{TRIP}$) and asserts the comparator circuit 206 output when $V_{RAMP}$ exceeds $V_{TRIP}$. A first current source 208 is coupled to a regulated supply node 211 (the voltage at which is notated DVDD) and to the first node 209. In the example of FIG. 2a, a second transistor 212 is coupled to the ground node 201 and to a second node 213. The second node 213 is also coupled to a control terminal of the second transistor 212 and a control terminal of the first transistor 210. A second current source 214 is coupled to the regulated supply node 211 and to the second transistor 212. A third transistor 204 is arranged in parallel with the capacitor 202, and thus is also coupled to the ground node 201 and to the first transistor 210.

In the example of FIG. 2a, the first transistor 210 is an n-type metal-oxide-semiconductor field-effect transistor (MOSFET) having a source coupled to the capacitor 202, a drain coupled to the first node 209, and a gate (generally, a control terminal). The second transistor 212 also is an n-type MOSFET having a source coupled to the ground node 201, a drain connected to the second node 213 and to a gate of the second transistor 212. The gate of the second transistor 212 is also coupled to the gate of the first transistor 210. The third transistor 204 also is an n-type MOSFET having a source coupled to the ground node 201, a drain coupled to the capacitor 202, and the source of the first transistor 210, and a gate coupled to an output 207 of the comparator circuit 206. In this example, a series of inverters 218a, 218b, 220a, 220b are positioned intermediate to the gate of the third transistor 204 and the output 207 of the comparator circuit 206, for example to serve as delay elements. The inverters 218a, 218b, 220a, 220b and other functionality are explained more fully below.

Finally, the relaxation oscillator 104 includes a latch 216, which, in the example of FIG. 2a, is a D flip flop. The D flip flop 216 includes a clock input coupled to the output 207 of the comparator circuit 206, an inverting output ($\overline{Q}$) coupled to a data input (D) of the D flip flop 216, and a non-inverting output (Q) coupled to a clock node. A signal provided by the non-inverting output to the clock node is the clock signal CLK_OUT of the relaxation oscillator 104, explained above with respect to FIGS. 1a and 1b.

Figure 2B:
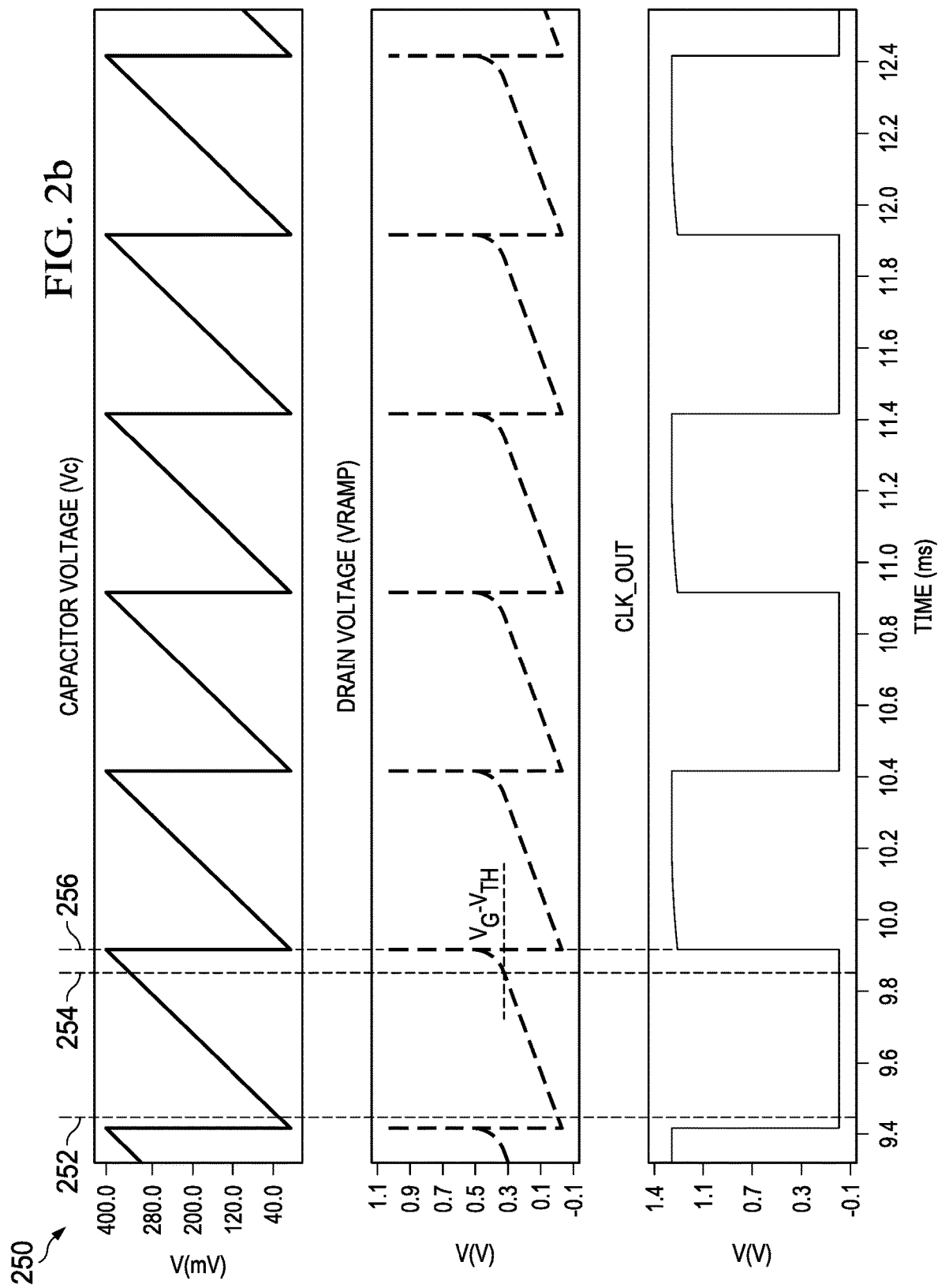
FIG. 2b shows a set of waveforms demonstrating voltages at various nodes of the relaxation oscillator circuit of FIG. 2a in accordance with various examples.

FIG. 2b shows an example set of waveforms 250 that demonstrate various voltages of the relaxation oscillator 104 during operation. In FIG. 2b, the x-axis of the waveforms 250 corresponds to time (e.g., in milliseconds), while the y-axes of the waveforms 250 represent various voltage levels. For example, the voltage across the capacitor 202 is notated $V_C$ and has the unit of millivolts; the voltage at the first node 209 (e.g., the drain of the first resistor 210) is notated $V_{RAMP}$ and has the unit of volts; while the output of the D flip flop 216 is notated CLK_OUT and has the unit of volts. Referring to FIGS. 2a and 2b, during operation of the relaxation oscillator 104, the first current source 208 provides a current that is proportional to absolute temperature ($I_{PTAT}$) to the first node 209. The input to the comparator circuit 206 is a high impedance input, and thus the current is directed to the first transistor 210.

Initially, for example at time 252 in FIG. 2b, the capacitor 202 is discharged so the voltage across the capacitor 202 ($V_C$) is equal to the voltage at the ground node 201, while the gate of the first transistor 210 is coupled to the regulated voltage node 211 by way of the gate-to-drain coupling of the second transistor 212. Thus, a gate-to-source voltage ($V_{GS}$) of the first transistor 210 is greater than a threshold voltage ($V_{TH}$) of the first transistor 210, and thus the first transistor 210 is on or conducting. At the same time, the voltage at the first node 209 ($V_{RAMP}$) is equal to $V_C$, which is below a trip voltage ($V_{TRIP}$) of the comparator circuit 206, and thus the output 207 of the comparator circuit 206 is de-asserted, so the gate of the third transistor 204 is low (e.g., at the voltage of the ground node 201) and thus the third transistor 204 is off and does not conduct. As a result, the first current source 208 charges the capacitor 202 and $V_{RAMP}$ rises with $V_C$.

As $V_{RAMP}$ and $V_C$ approach the gate voltage ($V_G$) of the first transistor 210, less $V_{TH}$ of the first transistor 210, $V_{GS}$ of the first transistor 210 approaches $V_{TH}$ of the first transistor 210 and thus the first transistor 210 begins to turn off. This is reflected at time 254 in FIG. 2b. At time 254, the first transistor 210 turns off and $V_{RAMP}$ rises quickly as a result of the first current source 208 charging the parasitic capacitance of the first transistor 210, which in an example is less than the capacitance of the capacitor 202. As a result, $V_{RAMP}$ quickly rises across the trip voltage of the comparator circuit 206 relative to the slower, linear rise that $V_C$ would experience in the absence of the first transistor 210. Thus, any variations in the trip voltage (e.g., PVT variations) of the comparator circuit 206 have a reduced impact on the frequency of the relaxation oscillator 104, because, for example, $V_{RAMP}$ rapidly passes through a voltage range of approximately 0.6-1.0 V, as shown in FIG. 2b. That is, $V_{RAMP}$ crosses a relatively wide voltage (e.g., 0.4 V in this example) range more quickly, and thus the frequency of the relaxation oscillator 104 remains stable even across variations in the trip voltage of the comparator circuit 206. Additionally, because $V_{RAMP}$ quickly crosses the trip voltage of the comparator circuit 206, switching current in the comparator circuit 206, which results when the input voltage is near but below the trip voltage of the comparator circuit 206, is further reduced.

When $V_{RAMP}$ crosses the trip voltage of the comparator circuit 206, the comparator circuit 206 asserts its output signal. For purposes of consistency and ease of explanation, it is assumed that an asserted signal refers to a high signal (e.g., the approximate voltage at the regulated supply node 211), while a de-asserted signal refers to a low signal (e.g., the approximate voltage at the ground node 201). However, the examples of this disclosure are not limited to assertion being a high signal, nor de-assertion being a low signal. For example, the comparator circuit 206 may be an inverting comparator circuit 206 and/or the number of inverters 218a, 218b following the comparator circuit 206 and leading to the D flip flop 216 may be altered so that the overall functionality of the relaxation oscillator 104 remains the same, despite different voltage levels corresponding to assertion and de-assertion of a signal.

Continuing the example of FIG. 2a, when the output 207 of the comparator circuit 206 is asserted, the inverters 218a, 218b serve as delay elements to pass the asserted signal to the clock input of the D flip flop 216. As a result of CLK_OUT being low at time 254, the inverting output and the data input of the D flip flop 216 are high, and thus when the clock input of the D flip flop 216 is asserted, CLK_OUT becomes high (e.g., at time 256 in FIG. 2b), reflecting the high data input.

In addition to CLK_OUT of the D flip flop 216 going high, when the output 207 of the comparator circuit 206 is asserted, the inverters 220a, 220b serve as additional delay elements to pass the asserted signal to the gate of the third transistor 204, which turns the third transistor 204 on and discharges the capacitor 202, causing $V_C$ to be equal to the voltage at the ground node 201. At this point, the first transistor 210 turns on again, and the above described process repeats itself. When the output 207 of the comparator circuit 206 is subsequently asserted (due to $V_{RAMP}$ again exceeding the trip voltage of the comparator circuit 206), the inverters 218a, 218b again serve as delay elements to pass the asserted signal to the clock input of the D flip flop 216. However, because CLK_OUT is high during the subsequent iteration, the inverting output and the data input of the D flip flop 216 are low, and thus when the clock input of the D flip flop is asserted, CLK_OUT becomes low, reflecting the low data input. In this way, the D flip flop 216 functions as a divide-by-2 circuit that toggles CLK_OUT from high-to-low or low-to-high each time $V_{RAMP}$ exceeds the trip voltage of the comparator circuit 206.

Additionally, the second transistor 212 is of the same type as the first transistor 210 and thus compensates for the effect of process or temperature variations on $V_{TH}$ of the first transistor 210. For example, because the first and second transistors 210, 212 are of the same type, if a process or temperature variation causes $V_{TH}$ of the first transistor 210 to increase (or decrease), then $V_{TH}$ of the second transistor 212 increases (or decreases) by a corresponding amount. Due to the gate-to-gate coupling of the second transistor 212 with that of the first transistor 210, $V_G$ of the first transistor 210 also increases (or decreases), and thus process or temperature variations affecting $V_{TH}$ of the first transistor 210 are compensated for by a corresponding increase (or decrease) in $V_{GS}$ of the first transistor 210.

Figure 2C:
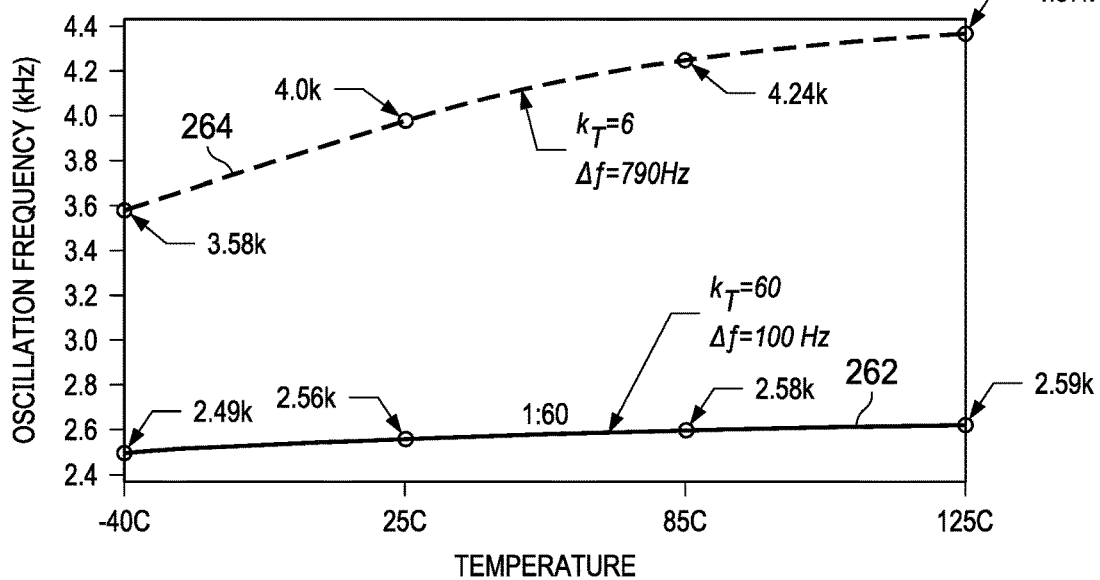
FIG. 2c shows a set of waveforms demonstrating an example impact of varying transistor ratios on frequency response of the relaxation oscillator circuit of FIG. 2a as a function of temperature in accordance with various examples.

FIG. 2c shows another example set of waveforms 260 that demonstrate frequency of the relaxation oscillator 104 as a function of temperature for different sizes of the first and second transistors 210, 212. In FIG. 2c, the x-axis of the waveforms 260 corresponds to temperature (e.g., in degrees Celsius), while the y-axes of the waveforms 260 represents relaxation oscillator 104 frequency (e.g., in kilohertz). In particular, the frequency of a relaxation oscillator 104 tends to be temperature-dependent due to the temperature-dependent nature of the first current source 208, and thus the charge rate of the capacitor 202 and $V_{RAMP}$. For example, because the current sources 208, 214 are temperature-dependent, the current sources 208, 214 generate a higher current at higher temperatures. If the trip point of the comparator circuit 206 were to stay the same, then the relaxation oscillator 104 frequency would increase with temperature, because the capacitor 202 would charge at a faster rate due to the increase in current supplied by the first current source 208. However, examples of this disclosure alter the ratio of the sizes of the first and second transistors 210, 212 (where the ratio of the second transistor 212 to the first transistor 210 is shown in FIG. 2a as 1:$k_T$) to reduce the temperature dependency of the relaxation oscillator 104 frequency.

In particular, in sub-threshold operation for each of the first and second transistors 210, 212:

$$I_{DS} \approx I_{D0}\left(\frac{W}{L}\right)e^{\frac{V_{GS}-V_{TH}}{\eta V_T}}$$

In the above equation, $I_{DS}$ is a drain-to-source current; $I_{D0}$ is sub-threshold saturation current; W and L are the width and length of the transistor 210, 212, respectively; $\eta$ is a process-dependent constant; and $V_T$ is thermal voltage, which is a temperature-dependent value (e.g., a variable proportional to temperature). Solving for $V_{GS}$ of each transistor 210, 212 gives:

$$V_{GS,212} - V_{GS,210} = \Delta V_{TH} + \eta V_T * \ln\left(\frac{W_{210}/L_{210}}{W_{212}/L_{212}}\right)$$

In some examples, the $\Delta V_{TH}$ between the transistors 210, 212 is 0, or small enough to be approximated as 0.

A trip voltage ($V_{TRIP}$) of the comparator circuit 206 is given by $$V_{TRIP} = V_{GS,212} - V_{TH,210} = \eta V_T * \ln\left(\frac{W_{210}/L_{210}}{W_{212}/L_{212}}\right)$$

$$V_{TRIP} = \eta V_T * \ln(k_T)$$

Where $k_T$ is the ratio of the first transistor 210 to the second transistor 212 as explained above and shown in FIG. 2a. $V_T$ is a temperature-dependent quantity (e.g., a variable as a function of temperature), and thus varying the ratio of the transistors 210, 212 sizes varies the slope of $V_{TRIP}$ as a function of temperature. In some examples, $k_T$ is selected such that the slope of $V_{TRIP}$ as a function of temperature is approximately equal (e.g., within +/−10%) to the slope of the bias current from the first current source 208 as a function of temperature, which results in a flatter relaxation oscillator 104 frequency response as a function of temperature, as shown by waveform 262 in FIG. 2c. In the example of FIG. 2c, a $k_T$ of 60 (e.g., the first transistor 210 is 60 times larger than the second transistor 212) results in the frequency response of the waveform 262 (e.g., a change in frequency of approximately 100 HZ from −40 C to 125 C). Additionally, as shown in FIG. 2c, a $k_T$ of 6 (e.g., the first transistor 210 is 6 times larger than the second transistor 212) results in the increased variability in frequency response as a function of temperature seen in the waveform 264 (e.g., a change in frequency of approximately 790 HZ from −40 C to 125 C).

Additionally, by utilizing first and second transistors 210, 212 having different threshold voltages, the size of the capacitor 202 can be tuned (e.g., reduced in size) for a given bias current from the first current source 208 and relaxation oscillator 104 frequency. For example, when the first and second transistors 210, 212 have the same threshold voltage, the $\Delta V_{TH}$ term above was equal to 0, and thus did not affect $V_{TRIP}$. However, by introducing a difference in the threshold voltages of the first and second transistors 210, 212, the $\Delta V_{TH}$ term serves as an offset to $V_{TRIP}$. By selecting the second transistor 212 to have a higher threshold voltage than the first transistor 210, $V_{TRIP}$ is increased for a given current from the first current source 208 and a given value of capacitance of the capacitor 202. Taken alone, an increase in $V_{TRIP}$ decreases the relaxation oscillator 104 frequency, because the capacitor 202 charges for longer to reach the increased $V_{TRIP}$. As a result, in an example the size of the capacitor 202 is reduced to counteract the reduction in frequency caused by the increased $V_{TRIP}$, because a smaller capacitor 202 charges faster.

The examples of this disclosure are not limited to a particular comparator circuit 206, described above. Rather, various comparator circuits 206, for example, that do not require a dedicated reference voltage to which to compare an input voltage, are within the scope of this disclosure. One example of such a comparator circuits 206 is a self-referenced comparator 300 as shown in FIG. 3a.

Figure 3A:
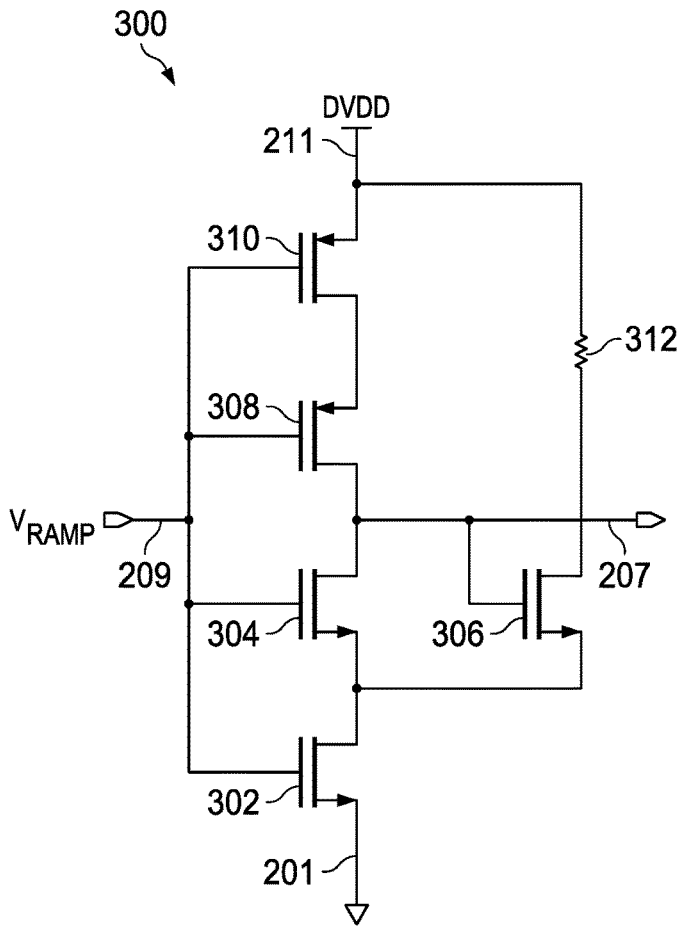
FIGS. 3a and 3b shows schematic diagrams of example comparator circuits in accordance with various examples.

In FIG. 3a, the self-referenced comparator 300 includes an input that is coupled to the first node 209 (referred to as input 209 for the purposes of FIG. 3a), and thus receives the voltage $V_{RAMP}$. The self-referenced comparator 300 also includes the output 207 described above. The self-referenced comparator 300 includes a transistor 302 coupled to a ground node 201, as well as transistors 304, 306 that are coupled to the transistor 302. A transistor 308 is coupled to the transistor 304, while a transistor 310 is coupled to the transistor 308 and to the regulated supply node 211. A resistor 312 is also coupled to the regulated supply node 211 and to the transistor 306.

In the example of FIG. 3a, the transistors 302, 304, 306 are n-type MOSFETs, while the transistors 308, 310 are p-type MOSFETs. In particular, the transistor 302 has a source coupled to the ground node 201, a drain coupled to the sources of the transistors 304, 306, and a gate coupled to the input 209. The transistor 304 has a drain coupled to the output 207 and a gate coupled to the input 209. The transistor 306 has a drain coupled to the resistor 312 and a gate coupled to the output 207. The transistor 308 has a drain coupled to the output 207, a gate coupled to the input 209, and a source coupled to the drain of the transistor 310. Finally, the transistor 310 has a source coupled to the regulated supply node 211 and the resistor 312 and a gate coupled to the input 209.

In the example of FIG. 3a, the self-referenced comparator 300 depicted is an inverting design and described as such below. However, it should be appreciated that the addition of an inverter to the input 209 or output 207 renders a non-inverting self-referenced comparator 300, and that the scope of this disclosure is not limited to a particular logic convention. During operation, when $V_{RAMP}$ is initially low (e.g., after the capacitor 202 in FIG. 2a is discharged), the p-type MOSFETs 308, 310 are conducting and thus the output 207 is initially high, being coupled to the regulated voltage node 211. The n-type MOSFET 306 is also conducting as its gate is coupled to the output 207. However, the n-type MOSFETs 302, 304 are not conducting because their gates are coupled to the input 209, which is low, and thus no current path is initially present through the resistor 312 and the n-type MOSFET 306.

As $V_{RAMP}$ rises due to being charged by the first current source 208 as explained above, the n-type MOSFETs 302, 304 begin to turn on as $V_{RAMP}$ nears the threshold voltage ($V_{TH}$) of the n-type MOSFETs 302, 304, while the p-type MOSFETs 308, 310 are still conducting and not yet fully turned off. Thus, based on the $V_{TH}$ of the n-type MOSFETs 302, 304, there is a period of time during the rise of $V_{RAMP}$ where two current paths exist from the regulated voltage node 211 to the ground node 201. One current path is the switching current path through the n-type MOSFETs 302, 304 and the p-type MOSFETs 308, 310. The other current path is the switching current in the regenerative path through the resistor 312, the n-type MOSFET 306, and the n-type MOSFET 302. Both current paths contribute to the quiescent current of the relaxation oscillator 104. As explained above, because the input 209 is $V_{RAMP}$ rather than $V_C$, the switching current through the self-referenced comparator 300 exists for a shorter time period each cycle due to the more rapid rise in $V_{RAMP}$ relative to the slower rise in $V_C$, which reduces the quiescent current of the relaxation oscillator 104.

Figure 3B:
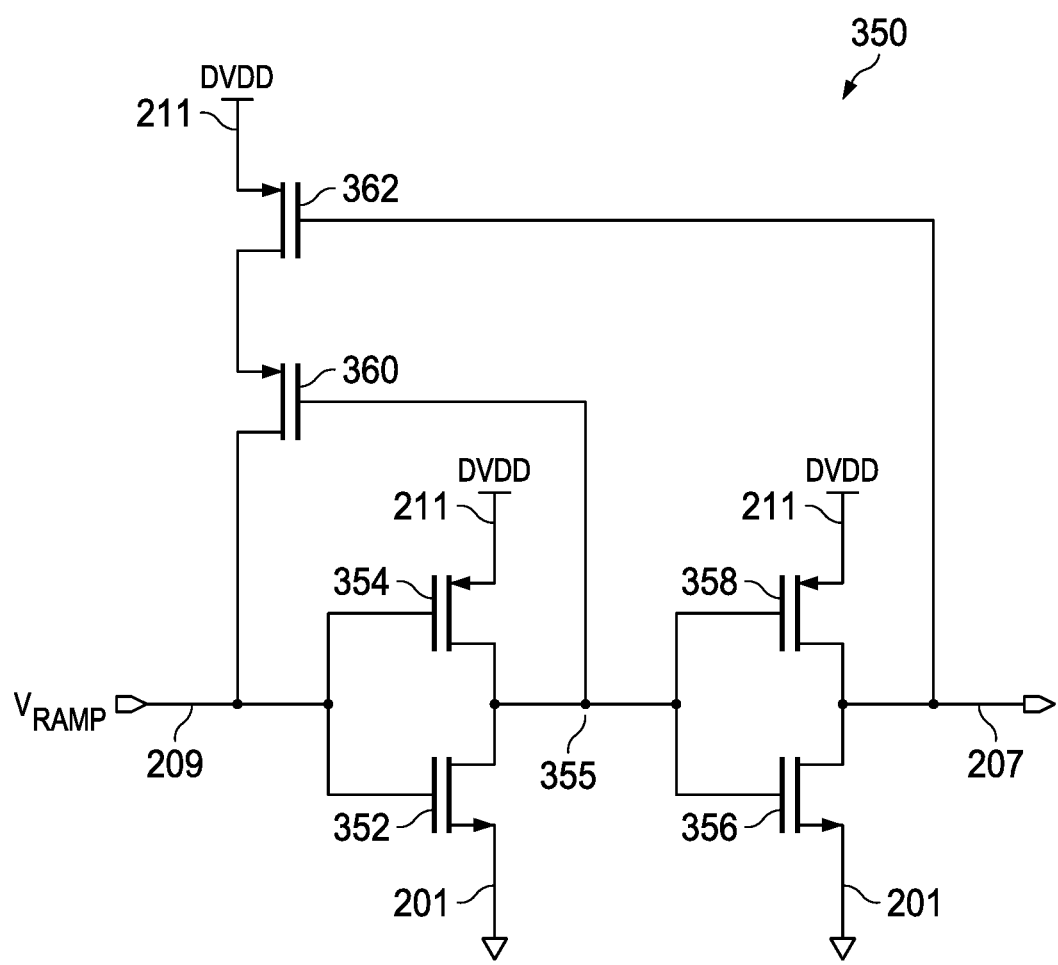

Another example of the comparator circuit 206 is a regenerative inverter comparator 350 as shown in FIG. 3b. In FIG. 3b, the regenerative inverter comparator 350 includes an input that is coupled to the first node 209 (referred to as input 209 for the purposes of FIG. 3b), and thus receives the voltage $V_{RAMP}$. The regenerative inverter comparator 350 also includes the output 207 described above. The regenerative inverter structure 350 includes a transistor 352 coupled to the ground node 201 and to an intermediate node 355, as well as a transistor 354, which is coupled to the intermediate node 355 and to the regulated supply node 211. The regenerative inverter structure 350 also includes a transistor 356 coupled to the ground node 201 and to the output 207, as well as a transistor 354, which is coupled to the output 207 and to the regulated supply node 211. The regenerative inverter structure 350 also includes a transistor 360, which is coupled to the input 209 and to another transistor 362. The transistor 362 is also coupled to the regulated supply node 211.

In the example of FIG. 3b, the transistors 352, 356 are n-type MOSFETS, while the transistors 354, 358, 360, 362 are p-type MOSFETs. In particular, the transistor 352 has a source coupled to the ground node 201, a drain coupled to the intermediate node 355, and a gate coupled to the input 209. The transistor 354 has a source coupled to the regulated voltage supply 211, a drain coupled to the intermediate node 355, and a gate coupled to the input 209. The transistor 356 has a source coupled to the ground node 201, a drain coupled to the output 207, and gate coupled to the intermediate node 355. The transistor 358 has a source coupled to the regulated voltage supply 211, a drain coupled to the output 207, and gate coupled to the intermediate node 355. The transistors 352, 354 function as an inverter, receiving the input 209 voltage as input and generating the intermediate node 355 voltage as an inverted output. Similarly, the transistors 356, 358 function as an inverter, receiving the intermediate node 355 voltage as input and generating the output 207 voltage as output. Additionally, the transistor 360 has a drain coupled to the input 209, a source coupled to the drain of the transistor 362, and a gate coupled to the intermediate node 355. The transistor 362 has a source coupled to the regulated voltage supply 211 and a gate coupled to the output 207.

During operation, when $V_{RAMP}$ is initially low (e.g., after the capacitor 202 in FIG. 2a is discharged), the p-type MOSFET 354 is conducting and thus the intermediate node 355 is high. As a result, the n-type MOSFET 356 is conducting and thus the output 207 is initially low, being coupled to the regulated voltage node 211. The p-type MOSFET 362 is conducting because its gate is coupled to the output 207, which is high. However, the p-type MOSFET 360 is not conducting because its gate is coupled to the intermediate node 355, which is low, and thus no current path is initially present through the p-type MOSFETS 360, 362 or the n-type MOSFET 352, which is also initially not conducting.

As $V_{RAMP}$ rises due to being charged by the first current source 208 as explained above, the n-type MOSFET 352 begins to turn on as $V_{RAMP}$ nears VTH of the n-type MOSFET 352, while the p-type MOSFET 354 is still conducting and not yet fully turned off. Further, as the n-type MOSFET 352 begins to turn on, the intermediate node 355 is pulled down, which results in the p-type MOSFET 360 also beginning to turn on. However, while the intermediate node 355 is beginning to be pulled down, the output 207 remains low for a period of time, and thus the p-type MOSFET 362 is still conducting. Thus, there is a period of time during the rise of $V_{RAMP}$ where a current path exists from the regulated voltage node 211 to the ground node 201. In particular, the current path is the switching current path through the n-type MOSFET 352 and the p-type MOSFET 354. This current path contributes to the quiescent current of the relaxation oscillator 104. As explained above, since the input 209 is $V_{RAMP}$ rather than $V_C$, the switching current through the regenerative inverter structure 350 exists for a shorter time period each cycle due to the more rapid rise in $V_{RAMP}$ relative to the slower rise in $V_C$, which reduces the quiescent current of the relaxation oscillator 104.

Figure 4A:
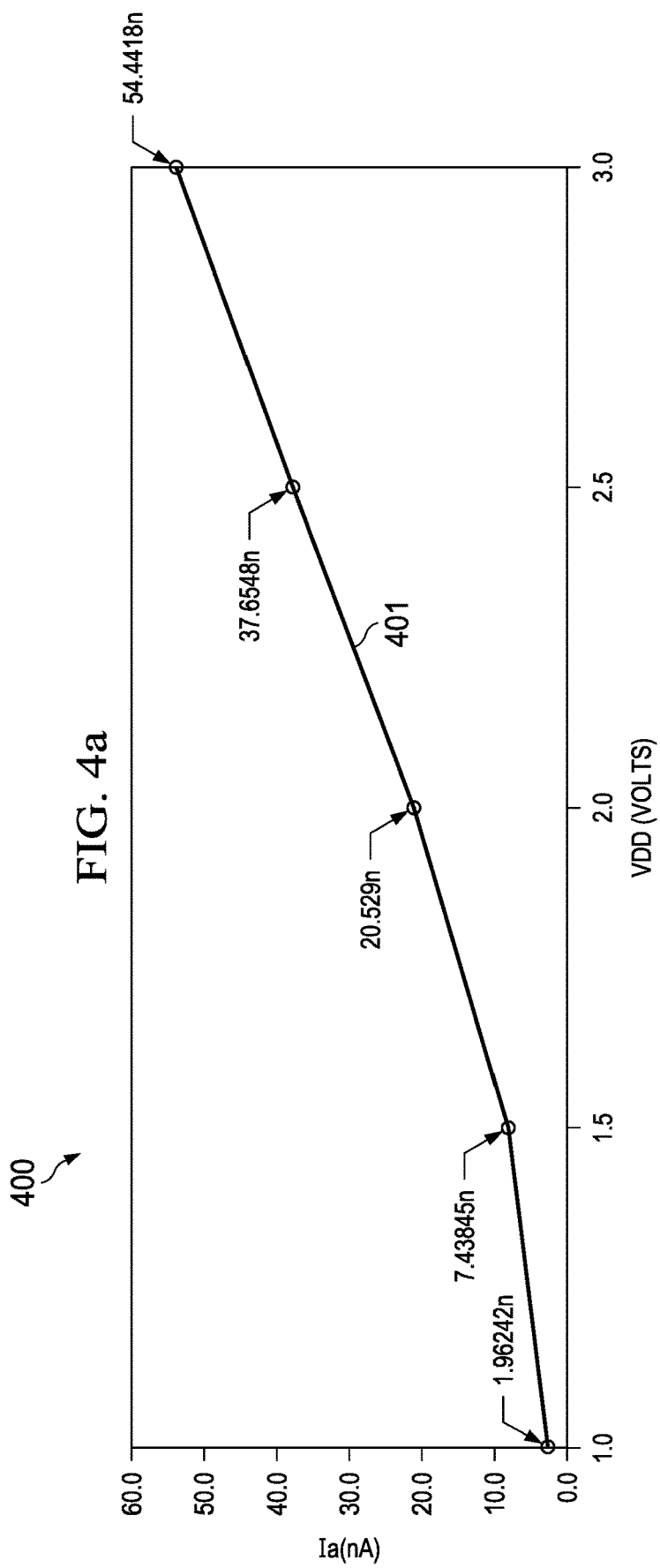
FIG. 4a shows a waveform demonstrating quiescent current as a function of supply voltage for a relaxation oscillator circuit in accordance with various examples.

FIG. 4a shows a waveform 401 that demonstrates quiescent current ($I_Q$, in nanoamperes) of the relaxation oscillator 104 as a function of supply voltage (DVDD, in volts) for the relaxation oscillator 104. In some examples, the supply voltage for the electronic device 100 is on the order of 1.5 V to 5 V. However, as can be seen by the waveform 401, $I_Q$ of the relaxation oscillator 104 increases as a function of the supply voltage for the relaxation oscillator 104. As a result, it is beneficial to provide the relaxation oscillator 104 with a sub-regulated voltage (e.g., a voltage that is less than the supply voltage for the electronic device 100).

Figure 4B:
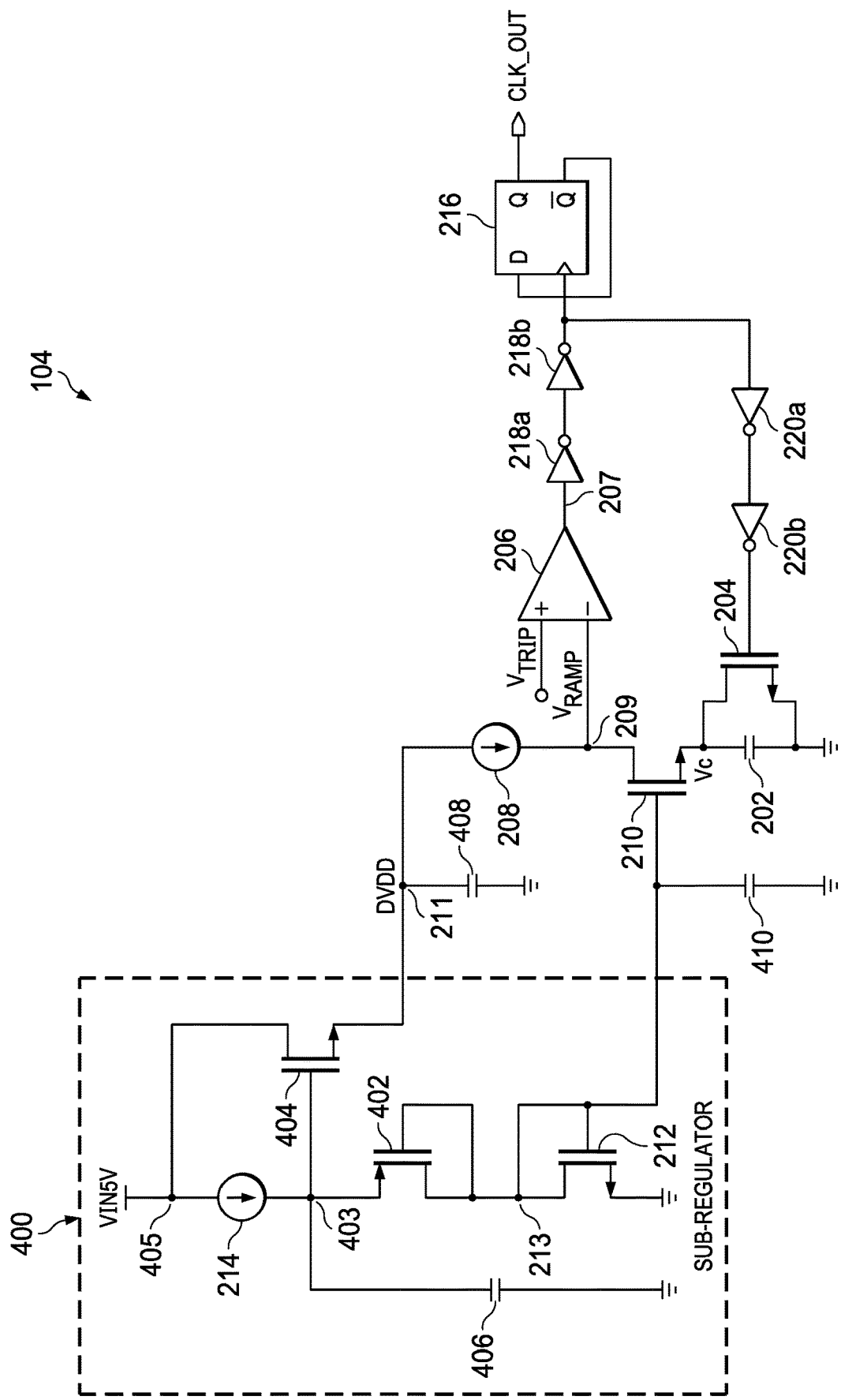
FIG. 4b shows a schematic diagram of an example sub-regulator circuit with the relaxation oscillator circuit in accordance with various examples.

FIG. 4b shows a sub-regulator circuit 400 integrated with components described above with respect to the relaxation oscillator 104. The sub-regulator circuit is coupled to a supply voltage for the electronic device 100 (VIN5V) and provides a sub-regulated voltage (DVDD) as the supply voltage for the relaxation oscillator 104. The sub-regulator circuit 400 includes the second transistor 212, described above, coupled to a transistor 402, which in this example is a p-type MOSFET. The transistor 402 is also coupled to a node 403. Both the second transistor 212 and the transistor 402 are diode-connected transistors in this example. The sub-regulator circuit 400 also includes a capacitor 406 coupled to the node 403, while the second current source 214 explained above is coupled to the node 403 and a supply node 405 (the voltage at which is notated VIN5V). The second current source 214 induces a voltage across the diode-connected transistors 212, 402, while the capacitor 406 acts as a filter to reduce the impact of supply voltage transients on a voltage at the node 403. The voltage at the node 403 is a value set by the second current source 214 and the diode-connected transistors 212, 402. The node 403 is also coupled to a control terminal (e.g., gate) of transistor 404, which in this example is an n-type MOSFET. The transistor 404 also includes a drain coupled to the supply node 405 and a source coupled to the regulated supply node 211. The transistor 404 acts as a source follower whose source voltage is a function of its gate voltage. As explained above, the voltage at the gate of the transistor 404 (e.g., the node 403) is determined by the second current source 214 and the sizing of the transistors 212, 402. Thus, the voltage at the node 403 is $V_{GS}$ of the second transistor 212 plus $V_{GS}$ of the transistor 402, while the voltage at the regulated supply node 211 is the voltage at the node 403 minus $V_{TH}$ of the transistor 404. In one example, the transistor 404 is a natural transistor, and thus has a $V_{TH}$ of approximately zero. The sub-regulator circuit 400 thus provides the sub-regulated voltage (DVDD) at the regulated supply node 211 independent of the fluctuation at the supply voltage at the supply node 405, which reduces sensitivity to the supply voltage of the electronic device 100 while also reducing the $I_Q$ of the relaxation oscillator 104, as described above. In addition to consuming less power, the relaxation oscillator 104 also provides a more consistent clock signal (CLK_OUT) to the computing circuitry 102, even across changes in voltage and/or temperature, which allows the computing circuitry 102 to consistently enter a first mode of operation (e.g., a high power mode) in response to receiving an edge (e.g., a rising edge or a falling edge) of the clock signal from the relaxation oscillator 104.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, etc.), these components may be exchanged for components of other process technologies (e.g., replace FET and/or MOSFET with BJT, replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A device, comprising:
  a capacitor having a first terminal coupled to a ground node, and a second terminal;
  a first transistor comprising a source coupled to the capacitor, a drain coupled to a first node, and a gate;
  a first current source coupled to the first node and configured to couple to a regulated supply node;
  a second transistor comprising a source coupled to the ground node, a drain coupled to a second node, and a gate coupled to the second node and to the gate of the first transistor; and a comparator circuit comprising an input coupled to the first node and an output configured to couple to a clock node.

2. The device of claim 1, wherein the comparator circuit comprises a self-referenced comparator.

3. The device of claim 1, wherein the comparator circuit comprises a regenerative inverter comparator.

4. The device of claim 1, further comprising a D flip flop, comprising:
a data input;
a clock input coupled to the output of the comparator circuit;
an inverting output coupled to the data input; and
a non-inverting output coupled to the clock node.

5. The device of claim 1, further comprising a third transistor in parallel with the capacitor, the third transistor comprising a control terminal coupled to the output of the comparator circuit.

6. The device of claim 1, further comprising:
a third transistor comprising a drain coupled to the second node, a source coupled to a third node, and a gate coupled to the second node;
a second current source coupled to a supply node and to the third node; and
a fourth transistor comprising a source coupled to the regulated supply node, a drain coupled to the supply node, and a gate coupled to the third node.

7. The device of claim 6, wherein:
the first transistor comprises an n-type metal-oxide-semiconductor field-effect transistor (MOSFET);
the second transistor comprises an n-type MOSFET;
the third transistor comprises a p-type MOSFET; and
the fourth transistor comprises an n-type MOSFET.

8. The device of claim 7, wherein the fourth transistor comprises a natural transistor.

9. A system, comprising:
computing circuitry configured to enter a high power mode in response to receiving an edge of a clock signal; and
an oscillator coupled to the computing circuitry and configured to provide the clock signal to the computing circuitry, the oscillator comprising:
a capacitor having a first terminal coupled to a ground node, and a second terminal;
a first transistor comprising a source coupled to the capacitor, a drain coupled to a first node, and a gate;
a first current source coupled to the first node and to a regulated supply node;
a second transistor comprising a source coupled to the ground node, a drain coupled to a second node, and a gate coupled to the second node and to the gate of the first transistor; and
a comparator circuit comprising an input coupled to the first node and an output coupled to a clock node to provide the clock signal to the computing circuitry.

10. The system of claim 9, wherein the comparator circuit comprises a self-referenced comparator.

11. The system of claim 9, wherein the comparator circuit comprises a regenerative inverter comparator.

12. The system of claim 9, wherein the oscillator further comprises a D flip flop, comprising:
a data input;
a clock input coupled to the output of the comparator circuit;
an inverting output coupled to the data input; and
a non-inverting output coupled to the clock node.

13. The system of claim 9, wherein the oscillator further comprises a third transistor in parallel with the capacitor, the third transistor comprising a control terminal coupled to the output of the comparator circuit.

14. The system of claim 9, wherein the oscillator further comprises:
a third transistor comprising a drain coupled to the second node, a source coupled to a third node, and a gate coupled to the second node;
a second current source coupled to a supply node and to the third node; and
a fourth transistor comprising a source coupled to the regulated supply node, a drain coupled to the supply node, and a gate coupled to the third node.

15. The system of claim 14, wherein:
the first transistor comprises an n-type metal-oxide-semiconductor field-effect transistor (MOSFET);
the second transistor comprises an n-type MOSFET;
the third transistor comprises a p-type MOSFET; and
the fourth transistor comprises a natural n-type MOSFET.

16. The system of claim 9, further comprising a battery configured to provide a supply voltage to the supply node.

17. A device, comprising:
a capacitor coupled to a ground node;
a current source configured to charge the capacitor;
a first transistor coupled to the capacitor, wherein the first transistor is configured to turn off in response to a voltage across the capacitor exceeding a threshold voltage less than a gate voltage of the first transistor;
a comparator circuit comprising an input coupled to the first transistor and an output coupled to a clock node, wherein the comparator circuit is configured to assert its output when a voltage at the input is above a trip voltage, wherein the trip voltage is greater than the threshold voltage less than the gate voltage of the first transistor; and
a second transistor configured to increase the gate voltage of the first transistor in response to an increase in a threshold voltage of the second transistor.

18. The device of claim 17, further comprising a D flip flop coupled to the output of the comparator circuit and to the clock node and configured to toggle the clock node in response to receiving an asserted signal from the comparator circuit.

19. The device of claim 17, further comprising a third transistor in parallel with the capacitor, the third transistor configured to discharge the capacitor in response to receiving an asserted signal from the comparator circuit.

20. The device of claim 17, further comprising:
a third transistor coupled to the second node and to a third node;
a second current source coupled to a supply node and to the third node; and
a fourth transistor coupled to the supply node and to the regulated supply node,
wherein the second and third transistors comprise diode-coupled devices and are configured to provide a voltage at the third node in response to receiving current from the second current source, and
wherein the fourth transistor is configured to provide a voltage to the regulated supply node based on the voltage at the third node.

* * * * *